United States Patent [19]

Oehlmann et al.

[11] Patent Number: 5,165,987
[45] Date of Patent: Nov. 24, 1992

[54] ADAPTING FREQUENCY BAND OF OSCILLATING CIRCUIT MADE FROM A METAL-PLASTIC-METAL SANDWICH FOIL AND SANDWICH FOIL FOR IMPLEMENTING THE PROCESS

[75] Inventors: Klaus Oehlmann, Engen; Franz Kolb, Rielasingen; Dietrich Bubeck; Martin Werner, both of Singen, all of Fed. Rep. of Germany

[73] Assignee: Swiss Aluminium Ltd., Chippis, Switzerland

[21] Appl. No.: 811,941

[22] Filed: Dec. 23, 1991

Related U.S. Application Data

[62] Division of Ser. No. 392,945, Jul. 26, 1989, Pat. No. 5,124,523.

[30] Foreign Application Priority Data

Dec. 23, 1987 [DE]  Fed. Rep. of Germany ....... 3743863
Jun. 4, 1988 [DE]  Fed. Rep. of Germany ....... 3819106

[51] Int. Cl.$^5$ .................. B32B 3/00; B32B 15/00; B44C 1/22; C23F 1/00

[52] U.S. Cl. .................. 428/209; 156/634; 156/656; 156/659.1; 156/665; 156/902; 428/458; 430/318

[58] Field of Search .................. 156/659.1, 656, 634, 156/665, 902; 428/209, 421, 422, 457, 458, 461, 901; 430/313, 318; 219/121.69

[56] References Cited

U.S. PATENT DOCUMENTS 4,292,388  9/1981  Ikeda et al. .................. 156/665 X
4,935,093  6/1990  Reeb .................. 156/902 X Primary Examiner—William A. Powell
Attorney, Agent, or Firm—Bachman & LaPointe

[57] ABSTRACT

Foil includes a first etch-resistant layer which at least partially covers the neighboring layer and has a weight per unit area of 0.5–20 g/m$^2$, a first aluminum or aluminum alloy layer having a thickness of about 30 um to 150 um, a dielectric layer of plastic having a thickness of about 5 to 100 um, a second aluminum or aluminum alloy layer having a thickness of about 30 um to 150 um, and a second etch-resistant layer which at least partially covers the neighboring layer and has a weight per unit area of 0.5 to 20 g/m$^2$.

14 Claims, 1 Drawing Sheet

ADAPTING FREQUENCY BAND OF OSCILLATING CIRCUIT MADE FROM A METAL-PLASTIC-METAL SANDWICH FOIL AND SANDWICH FOIL FOR IMPLEMENTING THE PROCESS

This is a division of application Ser. No. 392,945 filed Jul. 26, 1989, now U.S. Pat. No. 5,124,523.

BACKGROUND OF THE INVENTION

The invention relates to a process for frequency range tuning a resonant circuit of metal-plastic-metal laminate foil for an identification label or tag and a laminate foil suitable for carrying out the process.

Identification tags are employed with a single resonant circuit for example thief-proof labels, or a plurality of resonant circuits such as for example for arranging objects such as packets, cases or in certain countries in vehicles to calculate road user's taxes, in all cases for non-contact identification of objects that are not kept in a fixed place.

The production and use of the resonant circuit of metal-plastic-metal laminate foil for such identification labels or tags is in fact known from U.S. Pat. No. 3,671,721 and WO 86/02186. In order to employ resonant circuits as identification tag/tags IL is necessary that each resonant circuit causes interference within an exactly prescribed frequency range of close tolerance and, consequently, for example when used as a tag to prevent theft, actuates an optical or accoustic signal.

A resonant circuit can be made from a metal-plastic-metal laminate foil which, from the choice of material is of high quality and can be manufactured in a continuous manner. Difficulties do arise in large scale or mass production of resonant circuit structures of metal-plastic-metal laminate foils as the production parameters and in particular the thickness tolerances of the layers of laminate foil used, as well as the alterations in the foil necessary in the construction of the individual resonant circuits, have a considerable influence on the detection frequency of the finished resonant circuit.

SUMMARY OF THE INVENTION

The object of the invention is therefore to develop a suitable process by means of which it is possible, at high speed, semi-continuously and fully automatically to tune the frequency of resonant circuits for identification tags made from rolls of laminate foil to a particular frequency range value and to develop a laminate foil suitable for carrying out the said process.

Metal-plastic-metal laminate foils are as such well known. The object of the invention in this respect lies in the choice of the individual components thereof.

With respect to the process the object of the invention is achieved in accordance with the present invention which comprises a process for frequency range tuning a resonant circuit of metal-plastic-metal laminate foil for an identification tag, in which in the case of resonant circuits having frequencies less than the intended frequency, made from laminate foil rolls or the like joined together by means of at least one common plastic foil and moved forward in an almost continuous manner, the actual frequency of a first resonant circuit is determined by a first frequency measurement cell and compared with the prescribed, intended frequency, the difference in frequency communicated to a correction unit which regulates a trimming unit that when the said first resonant circuit is fed to it is designed to correct the actual frequency of the first resonant circuit to the intended frequency by shortening i.e. trimming the condensor foil part remote from the spool part, after leading the first resonant circuit to a second frequency measurement cell the new actual frequency is determined whereupon, if this lies within the intended frequency range, the position of the trimming unit determined by the correction unit is taken as the basis for setting the trimming unit for a subsequent resonant circuit so that for the final positioning of the trimming unit to trim the next resonant circuit only small corrections are required or, if the new actual frequency lies outside the intended frequency range, this first resonant circuit is marked and for the tuning of a subsequent resonant circuit the measurement is started again using the prescribed, intended frequency.

In accordance with the present invention, the measurement cells may perform an oscillating frequency-range sensing operation. Further, not more than nine resonant circuits, preferably 3-5 resonant circuits, may be present between the first and second measuring cells. Further, the trimming unit may be integrated in a measuring cell, preferably the first measuring cell. Still further, after dividing up the laminate foil roll or the like into individual resonant circuits, the resonant circuits not in the intended frequency range after the tuning operation or marked resonant circuits are rejected. In addition, the process uses a laminate foil with preferred aluminum or aluminum alloy layers in which in order to prevent electrical contact between the aluminum layers, the trimming is performed from the side having the thinner aluminum or aluminum alloy layer. In addition, the trimming may be performed by means of a cut on the side of the thinner aluminum or aluminum alloy layer and such that the thinner layer is completely cut through and the underlying layer or layers are at most cut into.

Further, the object of the invention with respect to the laminate foil is achieved by way of a laminate foil for manufacturing an interference element for high frequency fields, in which it comprises, a first etch-resistant layer which at least partially covers the neighboring layer and has a weight per unit area of 0.5–20 g/m$^2$, preferably 1–4 g/m$^2$, a first aluminum or aluminum alloy layer having a thickness of about 30 um to 150 um, preferably 50–100 um, a dielectric layer of plastic having a thickness of about 5 to 100 um, preferably 10 to 20 um, a second aluminum or aluminum alloy layer having a thickness of about 30 um to 150 um, preferably 12–20 um and a second etch-resistant layer which at least partially covers the neighboring layer and has a weight per unit area of 0.5 to 20 g/m$^2$, preferably 1–4 g/m$^2$. Laminate foil is provided in which there is provided between the dielectric layer of plastic and the aluminum or aluminum alloy layers, a further dielectric layer that has a weight per unit area of about 0.01–20 g/m$^2$ and at the same time improves the bonding between the layers. In addition, the aluminum or aluminum alloy layers in order to improve the bonding to the neighboring layers may feature passivating surfaces produced by chemical or electrochemical pretreatment. Still further, the dielectric layer may comprise a substance of low polarity with a weight per unit area of 0.25–20 g/m$^2$ and preferably 0.8–20 g/m$^2$, or a substance of medium to high polarity having a weight per unit area of 0.01–10 g/m$^2$, preferably 0.3–2.0 g/m$^2$. Still further, the plastic may comprise a polyolefin, in particular polyethylene of medium to high density, polypropylene, polybutadiene or a derivative thereof produced by copolymerization or graftpolymerization. In addition, the dielectric layers may be produced by multiple extrusion such that the outer layers are of polyolefins with active bonding groups. Further, the plastic may be polystyrene or a fluorine-containing plastic, in particular tetrafluorethylene or tetrafluorethylene-texafluorpropylene polymer. Still further the bonding together of the layers is undertaken by extrusion lamination or calendering using pre-fabricated mono or multilayer layers. In addition, the dielectric layer may comprise plastic of polystyrene and the further dielectric layers may comprise a substance based on PVC acrylate and/or PVC acetate and the latter exhibit a weight per unit area between 0.5 and 1.5 g/m². Still further the dielectric layers may comprise dissolved polystyrene and each exhibits a weight per unit area of 3–15 g/m². In addition, the further dielectric plastic layer may comprise polypropylene and the dielectric layers may comprise polypropylene maleic acid or grafted polymers having a weight per unit area of 0.5 to 3 g/m², preferably 1.1–1.5 g/m². Still further, the etch-resistant layer may comprise a single or two-component lacquer or single or two-component printing ink which is deposited by a rotograveur or copper plate printing process, dried by heat or other radiation and possibly cured.

The present invention also resides in the use of the aforesaid laminate foil for producing printed circuit structures, in particular resonant circuits for identification tags, by etching away the parts of the aluminum or aluminum alloy layers not protected by the etch-resistant layer using alkaline and acidic baths. In addition, the present invention resides in the use of the laminate foil as aforesaid for the production of resonant circuits for identification tags, in the form of laminate foil rolls or the like, in which in a continuous process the laminate foil is passed through an alkaline bath having an NaOH content of 1–10% at a temperature of about 30°–60° C., and is heated at a temperature of 30°–60° C. in at least one acidic bath having a HCl content of 2–10% or another mineral acid or mixture thereof plus 10–150 g/l AlCl₃ or another appropriate Al-content of another aluminum salt, the said heating being sufficiently long that the aluminum not protected by the etch-resistant layer is removed.

BRIEF DESCRIPTION OF THE DRAWINGS

Further advantages, features and details of the invention are revealed in the following description of preferred exemplified embodiments in relation to the schematic drawings showing in FIG. 1 an arrangement for carrying out the process according to the invention, FIG. 2 a cross-section through a laminate foil according to the invention having a partially deposited etch-resistant layer, FIG. 3 a resonant circuit capacitor after frequency adjustment, FIG. 4 an enlarged view of part of FIG. 3.

DETAILED DESCRIPTION

Figure 1:
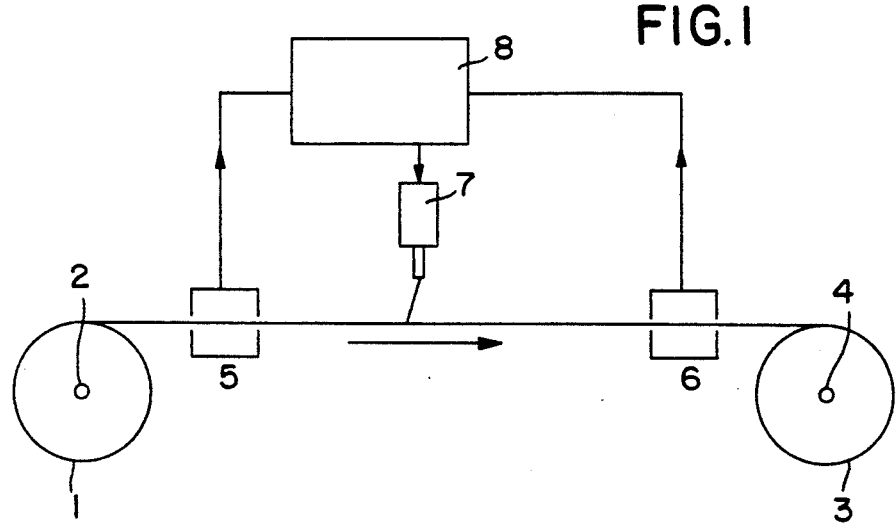

The above and subsequent material described as laminate foil roll items or the like need not absolutely be in roll form. Although normally stored and processed in roll form, it can also readily be as endless strip in folded package form and subjected to the process according to the invention.

The resonant circuits, produced in an almost endless strip and ready for checking, are passed one after the other through a first measuring cell where, preferably with the aid of oscillating frequencies, the actual frequency of each resonant circuit is determined and from that the difference with respect to the preselected, intended frequency. The said difference serves as reference parameter for specific trimming of the condenser part of the resonant circuit in order to achieve the intended frequency. By trimming the part of the condensor remote from the coil part, the capacitance is altered in such a manner that the resultant frequency of the resonant circuit should lie within the preselected, intended frequency range. Following this, remeasurement with a second measuring cell checks whether the desired, intended value has been achieved or if the resonant circuit then lies within the acceptable frequency range. The result is then transmitted to the correction unit which already controlled the trimming step with the aid of a trimming unit, so that the deviation from the intended value is taken into account at the next resonant circuit tuning.

By carefully selecting the components and the dimensions of the strip-like materials that come into question here, one need not anticipate a sudden change in the dimensions of the individual foils or the substance joining them. For that reason one hardly expects a pronounced deviation in the frequency of a subsequent resonant circuit not too far from an earlier resonant circuit. It turns out that over a distance of about 450 mm which with a present day size of resonant circuit of about 50 mm amounts to about 9 resonant circuits, only one significant change in frequency occurs. The deviation determined in the previous resonant circuit is therefore about the same in the subsequent resonant circuit so that the position of the trimming unit determined in the previous resonant circuit is for a first approximation also correct for trimming a subsequent resonant circuit following at such a short distance. Consequently the control unit takes this positioning of the trimming unit into account as a base value when determining the correction for the next resonant circuit to be tuned to the givin frequency range, and does so by allowing the said position to serve as the reference value, and adjusts the position of the trimming unit by a small correction with respect to that reference value to obtain the final position of the trimming unit. Should this small correction be within the tolerated width of frequency range for example if the trimming correction is performed by a mechanical tool using a stamping or sheaving action, and involves a traversing movement, then no correction is made.

Using this procedure the tuning of resonant circuits on laminate foil rolls or the like to a specific frequency range can be performed at high speed fully automatically and almost continuously.

The trimming of the condensor part can be performed with the aid of mechanical stamping or shearing tools, by high pressure water jets, by spark erosion or cutting with the help of a laser beam. In order to prevent short-circuiting of both condenser foils, the trimming or cutting of the condensor part must be carried out in such a manner that no electrical contact is created between the two metal foils which are separated by a dielectric comprised essentially of plastic, this because such short-circuiting would cause the condenser to fail and with that the identification tag also.

By appropricate design it is also possible, in particular when using a laser beam, for the purpose of trimming the condenser foil, to design a measuring cell, preferably the first, in such a way that the trimming unit is integrated in the measuring cell. It is, however, because of the already mentioned small dimensional change to be made in suitable metal-plastic-metal laminate foils, also possible to arrange the measuring cells a distance of up to ten resonant circuits apart and, in particular with mechanical trimming devices, to make a basic positioning value of a first resonant circuit the basis for a resonant circuit which follows nine resonant circuits after the first without penalty either in the tolerance of frequency range tuning or in the rate of tuning. With the present day normal dimension of resonant circuit of about 50 mm this means that the measuring cells can be spaced 450 mm apart so that the various tools for the trimming unit, as a stamping tool, a spark erosion tool, a cutting tool, a water jet, and a laser beam device, can be installed without difficulty, even if their characteristic size is relatively large.

A precondition for the process according to the invention is that the capacitance of the condensor before tuning is always larger than the capacitance required for the target frequency lying within the band width. In general therefore one starts from a capacitance which is too large and aims for the always lower-lying, intended capacitance by shortening the appropriate part of the foil. Particularly suitable for carrying out the process according to the invention is a metal-plastic-metal laminate foil in which the metal is aluminum or an aluminum alloy. The plastic layer is preferably made of a material with lowest possible dielectric loss factor, the choice of material and the make-up of the layer according to the invention being chosen or dimensioned such that the stability of a resonant circuit is not impaired.

A further aspect of the laminate foil according to the invention is in addition to the plastic layer, the provision of further dielectric layers which at the same time help the bonding to the aluminum or aluminum alloy layer. Substances having a low dielectric loss factor and good resistance to etching have proved to be particularly suitable. At the same time it is, according to the invention, necessary in the case of low polarily substances to keep the layer thickness of these substances as small as possible and, in the case of substances of moderate to high polarity, to choose a greater layer thickness.

Also within the scope of the invention is the deposition of a single or two-component etch-resistant layer using copper plate or rotogravure printing process. The etch-resistant layer thus deposited partially or everywhere on the aluminum or aluminum alloy substrate layer is subsequently dried or cured by heat, light or another form of radiation.

Although the screen-printing process is also basically suitable for this purpose, it exhibits the disadvantage with respect to the methods of deposition according to the process viz., rotogravure or copper plate printing, that it automatically leads to greater etch-resistant layer thickness. The conventional way of etching conductive strips, including the production of resonant circuits is piece-for-piece i.e. discontinuous. By way of contrast, in the process according to the invention the production of such structure, in particular resonant circuits, is preferably performed by etching away the parts not covered by the etch-resistant layer or, in the case of complete coverage by the etch-resistant layer employing the conventional methods of removal used for such circuits e.g. exposure, curing or washing-off in a combination of alkaline and acidic baths through which the metal-plastic-metal laminate foil passes as an almost endless strip in a continuous process.

Referring to the drawings, FIG. 1 shows the resonant circuits, made from the laminate foil according to the invention, which are in the form of laminate foil roll item 1 on a spool 2, and are being transferred in the direction of the arrow to spool 4 as laminate foil roll item 3. Situated between the spools are two frequency measurement cells 5, 6 with a trimming unit 7 between them, controlled by means of a correction unit 8. The individual resonant circuits are connected by a common plastic foil and are thus almost continuously fed to the frequency measuring cells 5, 6. On being fed to the first cell 5 the actual frequency is measured in the first resonant circuit and the value determined compared with the given intended frequency. The difference in frequency is communicated to the correction unit 8 which is indicated by the connection from cell 5 to the correction unit 8. The correction unit 8 regulates the trimming unit 7 which, after leading the measured resonant circuit to the same, attempts to correct actual frequency to the intended frequency by trimming the part of the condenser foil remote from the spool part i.e. by lowering the capacitance of the condenser. The regulation of the trimming unit 7 via the correction unit 8 is indicated by the connection between these units. The trimming can, as indicated here, take place by deflecting a laser beam or water jet. After leading the measured resonant circuit to the second frequency measuring cell 6, the new actual frequency value is determined and that value transmitted to the correction unit 8, which again is indicated by the connection between the frequency measurement cell 6 and correction unit 8. If the new actual frequency value lies within the intended frequency range, the position of the trimming unit 7 determined by the correction unit 8 is employed as the base value for setting the trimming unit for a subsequent resonant circuit. It makes therefore in a sense a new actual value for the measurement of the subsequent resonant circuit. By analogous actual/intended frequency comparison the difference in frequency is again determined which, in particular when using the laminate foil material according to the invention, is only small. This way the corrections necessary for trimming the next resonant circuit, communicated via the correction unit 8 to the trimming unit 7, are also small so that fast, accurate positioning of the trimming unit 7 is obtained.

If on the other hand the measured frequency of the first resonant circuit lies outside the intended frequency range, this resonant circuit is marked, and the measurement of the next resonant circuit is started again using the intended frequency for the frequency range tuning.

After the laminate foil roll has been divided into individual resonant circuits, those resonant circuits that do not lie within the given, intended frequency range are rejected, which is not shown in FIG. 1.

Figure 2:
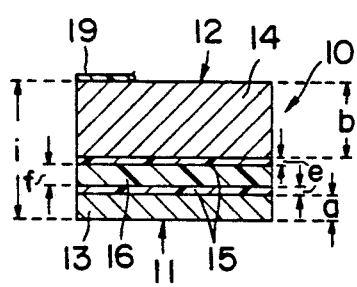
Figure 3:
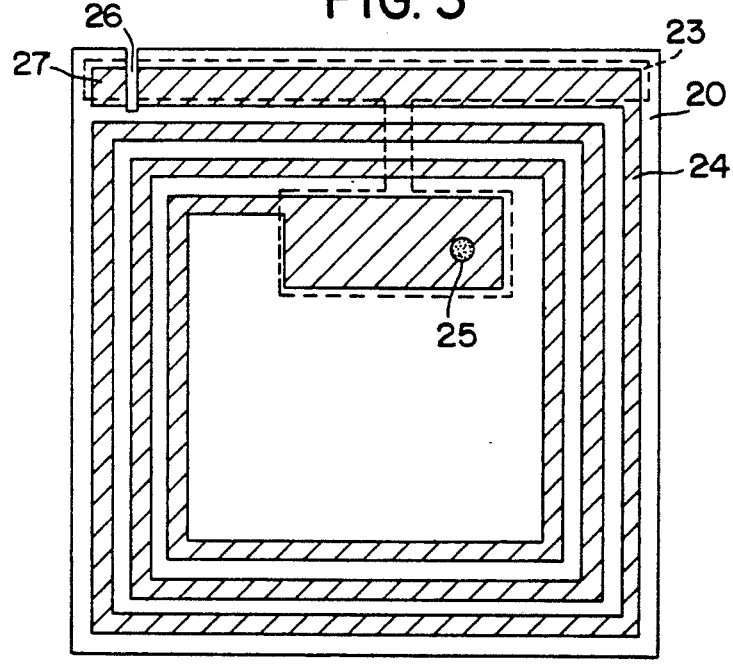

FIG. 2 shows a laminate foil 10 according to the invention of total thickness i. On the outer faces 11, 12 this features a partial etch resistant layer 19 and on the one side an aluminum layer 13 of thickness a, and on the other side an aluminum layer 14 of thickness b. Between is a dielectric layer of plastic 16 flanked on both sides by further dielectric layers 15, which at the same time exhibit good bonding to the aluminum layers 13, 14. FIG. 2 shows the preferred version of the laminate foil according to the invention, in particular that for the process of frequency tuning according to the invention where the thickness a of aluminum layer 13 is smaller than the thickness b of aluminum layer 14. In FIG. 3 the metal strip 24 forms the spool body and the superimposed metal foils the condenser 23 of a resonant circuit. Between the metal foils is the dielectric 20 comprising e.g. of the layers 15, 16, 15 which at the same time is the support of the spool part 24 as well as that of the condenser 23. The block situated in the middle serves as the element 25 for connecting up to the electrical circuit. The dielectric 20 is, at least partly, at the same time the common plastic foil for the circuits on a laminate foil roll, and is used for almost continuous feeding of the individual resonant circuits to the frequency measurement cells 5, 6 or trimming unit 7. The cut 26 shortens the condenser 23 by the part 27 thus adjusting the frequency of the resonant circuit to the desired frequency range.

Figure 4:
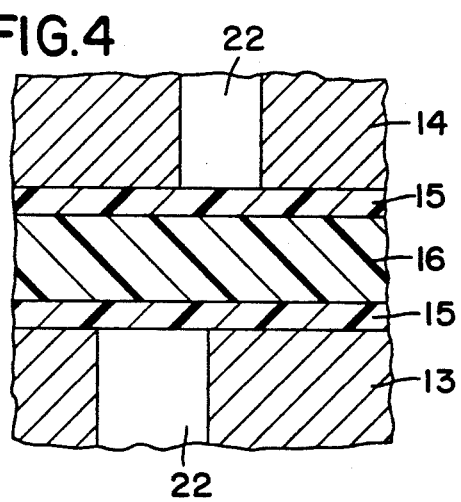

FIG. 4 shows a laminate foil according to the invention with layers 13, 14 of aluminum or aluminum alloy that have been etched away at places 22.

What is claimed is:

1. Laminate foil for manufacturing an interference element for high frequency fields, in which it comprises, a first etch-resistant layer which at least partially covers the neighboring layer and has a weight per unit area of 0.5-20 g/m², a first aluminum or aluminum alloy layer having a thickness of about 30 um to 150 um, a dielectric layer of plastic having a thickness of about 5 to 100 um, a second aluminum or aluminum alloy layer having a thickness of about 30 um to 150 um, and a second etch-resistant layer which at least partially covers the neighboring layer and has a weight per unit area of 0.5 to 20 g/m².

2. Laminate foil according to claim 1, in which there is provided, between the dielectric layer of plastic and the aluminum or aluminum alloy layers, a further dielectric layer that has a weight per unit area of about 0.01-20 g/m² and at the same time improves the bonding between the layers.

3. Laminate foil according to claim 1, in which the aluminum or aluminum alloy layers, in order to improve the bonding to the neighboring layers, feature passivated surfaces produced by chemical or electrochemical pretreatment.

4. Laminate foil according to claim 2, in which the dielectric layer comprises a material selected from the group consisting of a substance of low polarity with a weight per unit area of 0.25-20 g/m², and a substance of medium to high polarity having a weight per unit area of 0.01-10 g/m².

5. Laminate foil according to claim 1, in which the plastic comprises a material selected from the group consisting of polyolefin, polypropylene, polybutadiene or a derivative thereof produced by copolymerization or graftpolymerization.

6. Laminate foil according to claim 2, in which the dielectric layers are produced by multiple extrusion such that the outer layers are of polyolefins with active bonding groups.

7. Laminate foil according to claim 1, in which the plastic is a material selected from the group consisting of polystyrene and a fluorine-containing plastic.

8. Laminate foil according to claim 1, in which the bonding together of the layers is undertaken by extrusion lamination or calendering using pre-fabricated mono or multi-layer layers.

9. Laminate foil according to claim 2, in which dielectric layer comprises plastic of polystyrene and the further dielectric layers comprise of a substance based on material selected from the group consisting of PVC acrylate and PVC acetate, and the latter exhibit a weight per unit area between 0.5 and 1.5 g/m².

10. Laminate foil according to claim 2, in which the dielectric layers comprise dissolved polystyrene and each exhibits a weight per unit area of 3-15 g/m².

11. Laminate foil according to claim 2, in which the further dielectric plastic layer comprises polypropylene, the dielectric layers comprise a material selected from the group consisting of polypropylene maleic acid grafted polymers having a weight per unit area of 0.5 to 3 g/m².

12. Laminate foil according to claim 1, in which the etch-resistant layer comprises a single or two-component lacquer or single or two-component printing ink which is deposited by a rotogravure or copper plate printing process and dried.

13. Laminate foil according to claim 1 wherein parts of the aluminum or aluminum alloy layer not protected by the etch resistant layer are etched away using alkaline and acidic baths to produce printed circuit structures.

14. Laminate foil according to claim 13 in the form of laminate foil rolls, in which in a continuous process the laminate foil is passed through an alkaline bath having an NaOH content of 1-10% at a temperature of about 30°-60° C., and is heated at a temperature of 30°-60° C. in at least one acidic bath plus an aluminum salt, the said heating being sufficiently long that the aluminum not protected by the etch-resistant layer is removed.

* * * * *